United States Patent
Miao et al.

(10) Patent No.: US 6,580,322 B2
(45) Date of Patent: *Jun. 17, 2003

(54) DYNAMIC SWITCHING FREQUENCY CONTROL FOR A DIGITAL SWITCHING AMPLIFIER

(75) Inventors: Guoqing Miao, Roselle Park, NJ (US); Cary L. Delano, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/057,790

(22) Filed: Jan. 24, 2002

(65) Prior Publication Data

US 2002/0089376 A1 Jul. 11, 2002

Related U.S. Application Data

(63) Continuation of application No. 09/624,506, filed on Jul. 24, 2000, now Pat. No. 6,351,184.
(60) Provisional application No. 60/146,449, filed on Jul. 29, 1999.

(51) Int. Cl.[7] ............................................. H03F 21/00
(52) U.S. Cl. ................... 330/207 A; 330/251; 327/149; 333/18
(58) Field of Search .............................. 330/10, 207 A, 330/251; 327/149, 153, 158, 161; 333/18

(56) References Cited

U.S. PATENT DOCUMENTS

| | | | |
|---|---|---|---|
| 3,931,581 A | | 1/1976 | Kush et al. .................... 330/10 |
| 4,326,170 A | * | 4/1982 | Levy |
| 4,604,591 A | * | 8/1986 | Vasile |
| 4,673,887 A | | 6/1987 | Atherton ....................... 330/10 |
| 4,701,714 A | | 10/1987 | Agoston ....................... 328/56 |
| 5,144,173 A | | 9/1992 | Hui ............................. 307/603 |
| 5,521,539 A | | 5/1996 | Molin ......................... 327/274 |
| 5,554,950 A | | 9/1996 | Molin ......................... 327/277 |
| 5,838,193 A | * | 11/1998 | Myers et al. ................. 330/10 |
| 5,896,066 A | | 4/1999 | Katayama et al. ............ 331/17 |
| 5,963,086 A | * | 10/1999 | Hall |
| 6,100,733 A | * | 8/2000 | Dortu et al. |
| 6,194,932 B1 | | 2/2001 | Takemae et al. ............ 327/158 |

\* cited by examiner

*Primary Examiner*—Henry Choe
(74) *Attorney, Agent, or Firm*—Beyer Weaver & Thomas LLP

(57) ABSTRACT

A switching amplifier is described which includes an input stage having a first node associated therewith and a power stage having a second node associated therewith. An actual loop delay is defined with reference to the first and second nodes. Delay detection circuitry compares the actual loop delay to a reference loop delay. A dynamic delay line controlled by the delay detection circuitry controls the actual loop delay to correspond to the reference loop delay.

6 Claims, 3 Drawing Sheets

Fig. 4: Switching Frequency Vs. Loop Delay

Fig. 3: Switching Frequency Vs. Dynamic Range

Fig. 2: Power Efficiency Vs. Switching Frequency

US 6,580,322 B2

DYNAMIC SWITCHING FREQUENCY CONTROL FOR A DIGITAL SWITCHING AMPLIFIER

RELATED APPLICATION DATA

The present application is a continuation application of U.S. patent application Ser. No. 09/624,506 filed on Jul. 24, 2000, which claims priority from U.S. Provisional Patent Application No. 60/146,449 filed on Jul. 29, 1999. The entire disclosures of both of these applications are incorporated herein by reference for all purposes.

BACKGROUND OF THE INVENTION

The present invention relates to the power efficiency of switching amplifiers. More specifically, techniques are provided herein for improving the power efficiency of a switching amplifier by dynamically controlling its switching frequency.

In the switching amplifier 100 shown in FIG. 1, the input signal is modulated into one-bit digital data which is then used to control power stage MOSFETs M1 and M2 for power amplification. The amplified input signal is then recovered by a low pass filter comprising inductor L and capacitor $C_{AP}$. Break-before-make circuitry 102 ensures that M1 and M2 are never turned on simultaneously and, as a result, there is no DC power consumption in the power stage. Thus, the power loss in amplifier 100 is largely attributable to switching loss due to the charging and discharging of the parasitic capacitance at the power stage, i.e., $C_p$. This switching loss can be expressed as:

$$P_L = C_p \times V_{cc}^2 \times f_s$$

where $C_p$ is the total parasitic capacitance, $V_{cc}$ is the power supply voltage, and $f_s$ is the switching frequency.

To reduce the switching losses and thus increase the efficiency of amplifier 100, any of these three quantities may be reduced, at least theoretically. However, in practice, because the power supply voltage determines the output power, it cannot be changed for a particular output power requirement. In addition, because $C_p$ is a parasitic value it is virtually uncontrollable. Therefore, as a practical matter, the most feasible way to reduce switching loss in a switching amplifier is by reducing its switching frequency. FIG. 2 is a graph which illustrates the relationship between switching frequency and power efficiency for a switching amplifier. As shown in the figure, by reducing the switching frequency $f_s$ from sf2 to sf1, a gain in power efficiency from PE2 to PE1 is realized.

However, as shown in FIG. 3, when the switching frequency of a switching amplifier is below $f_t$, decreases in switching frequency are accompanied by corresponding decreases in the amplifier's output dynamic range. Thus, to avoid a loss of dynamic range, the amplifier's switching frequency should be kept at or above $f_t$.

It is therefore desirable to provide techniques by which the switching frequency of a switching amplifier may be controlled such that power efficiency is improved without unacceptable losses in dynamic range.

SUMMARY OF THE INVENTION

According to the present invention, techniques are provided by which the switching frequency of a switching amplifier is controlled to get a desired power efficiency. A dynamic delay line is inserted in the feedback loop of the switching amplifier and is controlled to maintain the loop delay of the amplifier equal to a reference delay. The delay line is controlled by delay detection circuitry which monitors the loop delay, compares it to the reference delay, and controls the delay line in 10 ns increments to bring the actual loop delay in line with the reference delay.

Thus, the present invention provides a method for controlling a switching frequency associated with a switching amplifier in which an actual loop delay associated with the switching amplifier is dynamically controlled to correspond to a reference loop delay.

According to another embodiment, a method for controlling a switching frequency associated with a switching amplifier is provided. An actual loop delay associated with the switching amplifier is monitored. The actual loop delay is compared with a reference loop delay. A delay line in the switching amplifier is dynamically controlled such that the actual loop delay corresponds to the reference loop delay.

According to yet another embodiment, a switching amplifier is provided which includes an input stage having a first node associated therewith and a power stage having a second node associated therewith. An actual loop delay is defined with reference to the first and second nodes. Delay detection circuitry compares the actual loop delay to a reference loop delay. A dynamic delay line controlled by the delay detection circuitry controls the actual loop delay to correspond to the reference loop delay.

According to a still further embodiment, a switching amplifier is provided. An input stage generates a switching signal and has a first node associated therewith. Break-before-make circuitry generates two drive signals from the switching signal. A power stage includes two switches which are alternately driven by the two drive signals and which has a second node associated therewith. An actual loop delay is defined with reference to the first and second nodes. A continuous-time feedback path is provided from the power stage to the input stage. Delay detection circuitry compares the actual loop delay to a reference loop delay. A dynamic delay line controlled by the delay detection circuitry controls the actual loop delay to correspond to the reference loop delay.

A further understanding of the nature and advantages of the present invention may be realized by reference to the remaining portions of the specification and the drawings.

DETAILED DESCRIPTION OF SPECIFIC EMBODIMENTS

Figure 4:
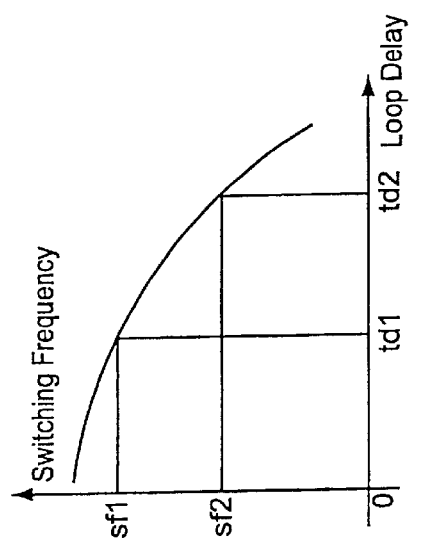
FIG. 4 is a graph illustrating the relationship between switching frequency and loop delay for a switching amplifier.
Figure 3:
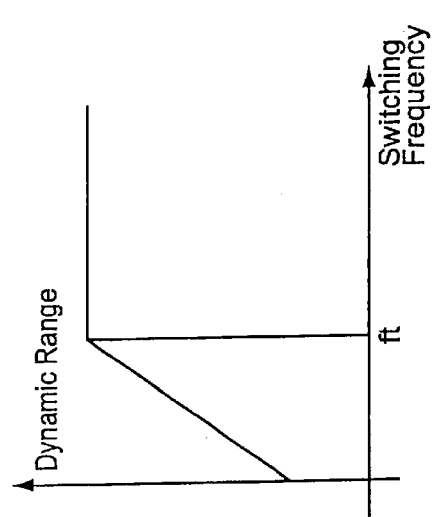
FIG. 3 is a graph illustrating the relationship between switching frequency and output dynamic range for a switching amplifier.
Figure 2:
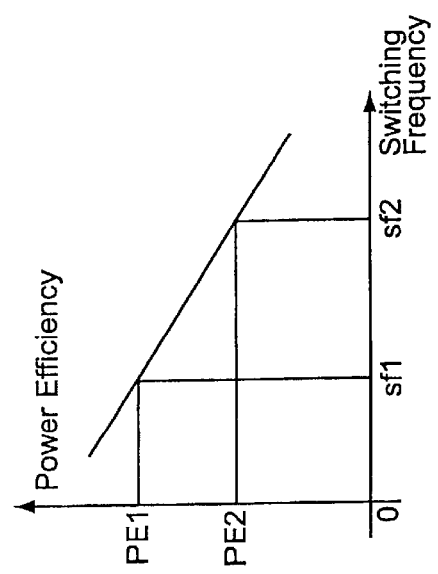
FIG. 2 is a graph illustrating the relationship between switching frequency and power efficiency for a switching amplifier.

According to a specific embodiment of the invention, a loop delay control technique is provided which takes advantage of the fact that there is a direct relationship between the loop delay of a switching amplifier and its switching frequency as shown in FIG. 4. As shown in the figure, increasing the loop delay from td1 to td2 results in a corresponding decrease in switching frequency from sf1 to sf2. Thus, as shown in FIG. 2, by selecting an appropriate loop delay, a desired power efficiency may be obtained. In addition, by mapping $f_t$ of FIG. 3 onto the graph of FIG. 4, a maximum allowable loop delay is identified below which the dynamic range of the amplifier remains unaffected.

Figure 1:
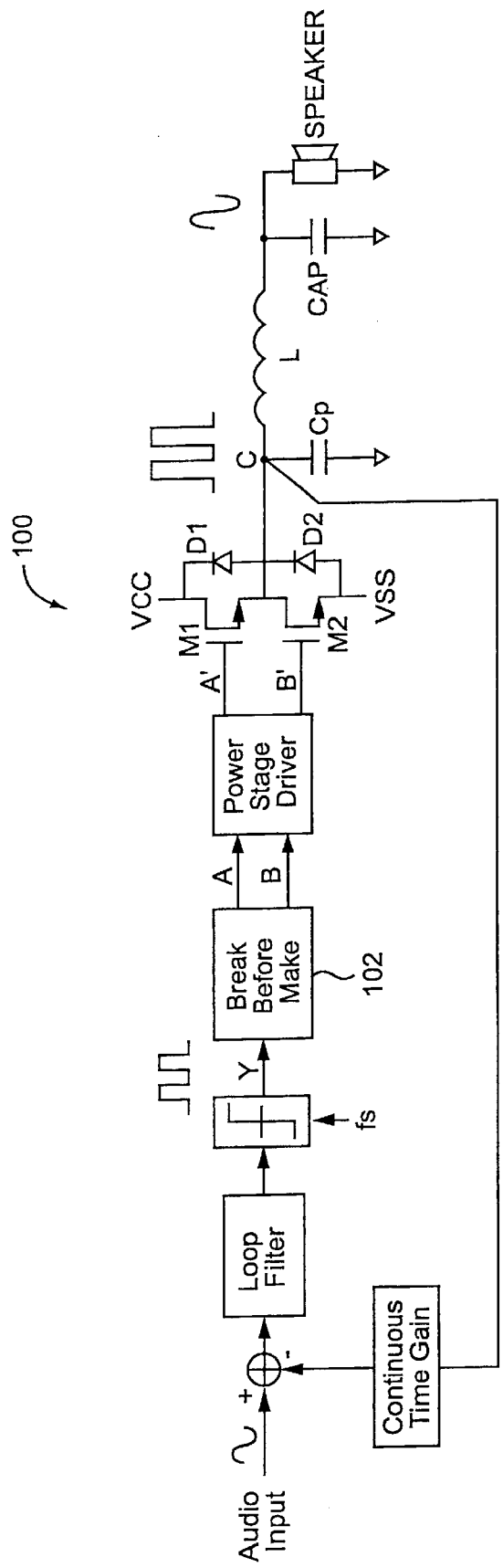
FIG. 1 is a simplified schematic diagram of a switching amplifier.
Figure 5:
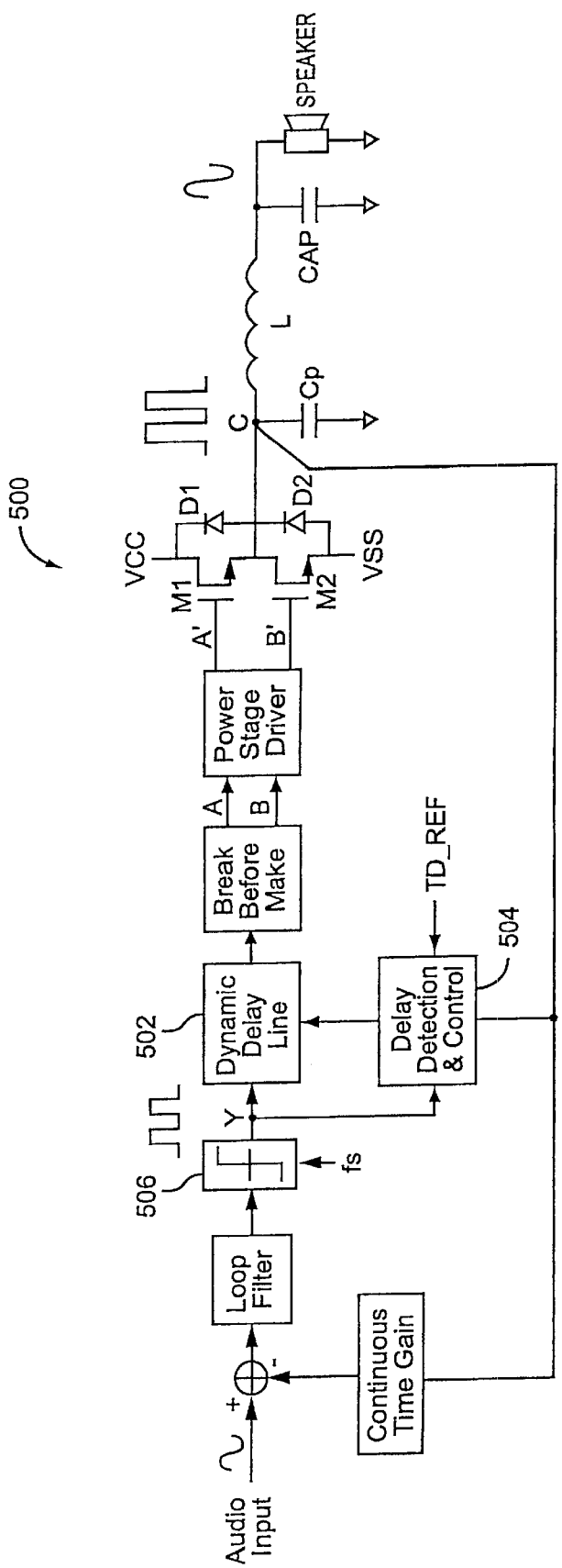
FIG. 5 is a simplified schematic diagram of a switching amplifier designed according to a specific embodiment of the present invention.

FIG. 5 is a simplified schematic diagram of a digital audio switching power amplifier 500 which is designed according to a specific embodiment of the present invention. Amplifier 500 operates similarly to amplifier 100 of FIG. 1 except that a dynamic delay line 502 is inserted in the feedback loop of amplifier 500. In addition, delay line 502 is controlled by delay detection circuitry 504 which measures the delay from the output of comparator 506 (node Y) to the output of the power stage (node C), which is defined in this embodiment as the actual loop delay for amplifier 500. Of course, it will be understood that the delay which is measured and used to control the delay line may be between any two points in the amplifier and still remain within the scope of the invention.

Delay detection circuitry 504 compares the measured loop delay with a reference delay (TD_REF) which corresponds to a particular switching frequency and a desired power efficiency for amplifier 500. According to a specific embodiment, the reference delay is selected to be less than or equal to the maximum allowable delay below which the dynamic range of the amplifier remains unaffected. If the measured loop delay is less than the reference delay, delay detection circuit 504 controls delay line 502 to increase its delay in 10 ns increments. If, on the other hand, the measured loop delay is greater than the reference delay, delay detection circuitry 504 controls delay line 502 to decrease its delay in 10 ns increments. These incremental changes in the delay continue until the measured or actual delay is substantially equal to the reference delay.

Thus, when the amplifier's loop delay changes with, for example, temperature, the delay detection circuitry automatically adjusts the delay line to ensure that the total loop delay, and thus the switching frequency and power efficiency, remains relatively constant. When the loop delay increases at higher temperatures, the delay of the delay line is reduced. When the loop delay decreases at lower temperatures, the delay is increased.

While the invention has been particularly shown and described with reference to specific embodiments thereof, it will be understood by those skilled in the art that changes in the form and details of the disclosed embodiments may be made without departing from the spirit or scope of the invention. For example, the present invention has been described with reference to a specific embodiment in which the amplifier is configured for a baseband audio application. However, it will be understood that the techniques described herein apply equally well to a wide variety of amplifier configurations and applications and that therefore the scope of the present invention is not limited to audio amplifiers. That is, the present invention may be used to improve amplifiers used for other applications such as, for example, ADSL line drivers. Therefore, the scope of the invention should be determined with reference to the appended claims.

What is claimed is:

1. A method for controlling a switching frequency associated with a switching amplifier, comprising dynamically controlling an actual loop delay in a feedback loop in the switching amplifier to correspond to a reference loop delay, thereby controlling the switching frequency to be substantially constant.

2. The method of claim 1 further comprising comparing the actual loop delay with the reference loop delay.

3. The method of claim 1 wherein dynamically controlling the actual loop delay comprises dynamically controlling a delay line such that the actual loop delay corresponds to the reference loop delay.

4. The method of claim 3 wherein dynamically controlling the delay line comprises adjusting the delay line in equal increments until the actual loop delay corresponds to the reference loop delay.

5. A method for controlling a switching frequency associated with a switching amplifier, comprising:

monitoring an actual loop delay in a feedback loop in the switching amplifier;

comparing the actual loop delay with a reference loop delay; and dynamically controlling a delay line in the switching amplifier such that the actual loop delay corresponds to the reference loop delay, thereby controlling the switching frequency to be substantially constant.

6. The method of claim 5 wherein dynamically controlling the delay line comprises adjusting the delay line in equal increments until the actual loop delay corresponds to the reference loop delay.

* * * * *